US008668777B2

(12) United States Patent
Okorn-Schmidt et al.

(10) Patent No.: US 8,668,777 B2
(45) Date of Patent: Mar. 11, 2014

(54) PROCESS FOR TREATING A SEMICONDUCTOR WAFER

(75) Inventors: Harald Okorn-Schmidt, Klagenfurt (AT); Dieter Frank, Velden (AT); Franz Kumnig, Lieserbruecke (AT)

(73) Assignee: Lam Research AG, Villach (AT)

( * ) Notice: Subject to any disclaimer, the term of this patent is extended or adjusted under 35 U.S.C. 154(b) by 561 days.

(21) Appl. No.: 12/976,510

(22) Filed: Dec. 22, 2010

(65) Prior Publication Data

US 2012/0160276 A1 Jun. 28, 2012

(51) Int. Cl.
*C23G 1/02* (2006.01)

(52) U.S. Cl.
USPC ........ 134/3; 134/2; 134/26; 134/28; 510/175; 510/176; 438/704; 438/705

(58) Field of Classification Search
USPC ............. 134/2, 3, 25.4, 26, 28; 438/704, 705; 510/175, 176
See application file for complete search history.

(56) References Cited

U.S. PATENT DOCUMENTS

| | | | | |
|---|---|---|---|---|
| 5,294,570 | A | 3/1994 | Fleming, Jr. et al. | |
| 6,145,519 | A | 11/2000 | Konishi et al. | |
| 6,240,933 | B1 * | 6/2001 | Bergman | 134/1.3 |
| 6,273,959 | B1 * | 8/2001 | Oonishi et al. | 134/2 |
| 2005/0176604 | A1 | 8/2005 | Lee et al. | |
| 2007/0119476 | A1 * | 5/2007 | Hara et al. | 134/1.3 |
| 2011/0230054 | A1 | 9/2011 | Tomita et al. | |

OTHER PUBLICATIONS

International Search Report, dated May 16, 2012, from corresponding PCT application No. PCT/IB11/55777.

* cited by examiner

*Primary Examiner* — Saeed T Chaudhry
(74) *Attorney, Agent, or Firm* — Young & Thompson

(57) ABSTRACT

Mixtures containing concentrated sulfuric acid used for stripping photoresist from semiconductor wafer, such as SOM and SPM mixtures, are more quickly removed from a wafer surface using another liquid also containing high concentration of sulfuric acid, with the second liquid furthermore containing controlled small amounts of fluoride ion. The second liquid renders the wafer surface hydrophobic, which permits easy removal of the sulfuric acid therefrom by spinning and/or rinsing.

20 Claims, 3 Drawing Sheets

PROCESS FOR TREATING A SEMICONDUCTOR WAFER

BACKGROUND OF THE INVENTION

1. Field of the Invention

The invention relates to processes for treating disc-shaped articles such as semiconductor wafers and glass wafers, and especially to processes for cleaning surfaces of semiconductor wafers.

2. Description of Related Art

Semiconductor wafers undergo a variety of wet processing stages during manufacture of integrated circuits, such as removal of photoresist from the wafer. When the photoresist is stripped by a wet process, typically a strong inorganic acid is used at high concentration, with sulfuric acid being most prevalent. Among the chemical compositions used for that stripping are solutions of sulfuric acid mixed with hydrogen peroxide (SPM) and mixtures of ozone and sulfuric acid (SOM). Also mixtures of sulfuric acid with hydrogen peroxide and ozone (SPOM) are being sometimes used.

The cleaning solution or mixture including a high concentration of strong inorganic acid must then itself be removed from the wafer surface. However, highly concentrated inorganic acids, and especially sulfuric acid, are highly viscous, and it therefore requires an extended period of rinsing to remove the acid-based cleaning liquid from the wafer surface.

For example, removal of the sulfuric acid after a convenional photoresist strip process in a process module for single wafer wet processing typically requires a minimum of 150 seconds when deionized water (DI) followed by an SC-1 mixture ($NH_4OH/H_2O_2/H_2O$) is being used, with the necessary time being approximately twice as long as that when only deionized water (DI) is used to rinse away the acid. A shorter rinsing time leads to a time dependent crystal formation on the substrate surface.

In addition, when using an SC-1 mixture significant equipment problems arise due to crystal formation in the exhaust and drain lines, those crystals being the product of ammonia vapor reacting with sulfate residues to form for example ammonium sulfate and ammonium bisulfate. This protracted removal step also leads to higher cost of ownership and lower throughput due to higher chemical consumption and long process times.

Similarly, semiconductor processing already consumes substantial volumes of deionized ultrapure water (UPW), which can have a negative environmental impact, especially given that the current generation of 300 mm wafer has more than twice the surface area of the previous 200 mm wafer. Soon 450 mm wafer might become the next new standard for semiconductor processing, which will necessitate still further measures to reduce the usage of ultra pure water (UPW). Techniques that limit consumption of ultrapure water during processing of semiconductor wafers will therefore yield multiple benefits.

SUMMARY OF THE INVENTION

The present inventors have discovered that highly concentrated inorganic acids used in a stripping operation during the processing of semiconductor wafers can be more quickly and effectively removed from the wafer surface by rinsing with a liquid that is itself a relatively concentrated solution of strong inorganic acid and contains a controlled quantity of fluoride ion.

A method according to the invention is applicable to disc-shaped articles generally, including not only semiconductor wafers but also, for example, glass discs. The method comprises dispensing a first liquid onto a surface of the disc-shaped article, the first liquid containing at least one inorganic acid at a concentration of at least 90 wt.-%, the first liquid having a fluoride ion concentration of below 10 ppm; and removing at least part of the first liquid with a second liquid containing at least one inorganic acid at a concentration of above 50 wt.-%, the second liquid having a fluoride ion concentration of above 1 ppm. The fluoride ion concentration of the second liquid is at least twice that of the first liquid.

In one aspect of the invention, a process for treating a wafer comprises dispensing a first liquid onto a wafer surface, the first liquid containing one or more strong inorganic acids, preferably sulfuric acid, at a concentration of above 90% by weight, with the first liquid having a fluoride ion concentration of below 10 ppm. The first liquid is then removed with a second liquid containing one or more strong inorganic acids, preferably sulfuric acid, at a concentration in excess of 50% by weight, with the second liquid having a fluoride ion concentration of above 10 ppm.

In another aspect of the invention, a process for treating a wafer comprises dispensing a first liquid onto a wafer surface, the first liquid containing one or more strong inorganic acids, preferably sulfuric acid, at a concentration of above 90% by weight, with the first liquid being free of added fluoride ion. The first liquid is then removed with a second liquid containing one or more strong inorganic acids, preferably sulfuric acid, at a concentration in excess of 50% by weight, with the second liquid having a fluoride ion concentration of 1-1000 ppm, preferably 4-500 ppm, and more preferably 15-200 ppm.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
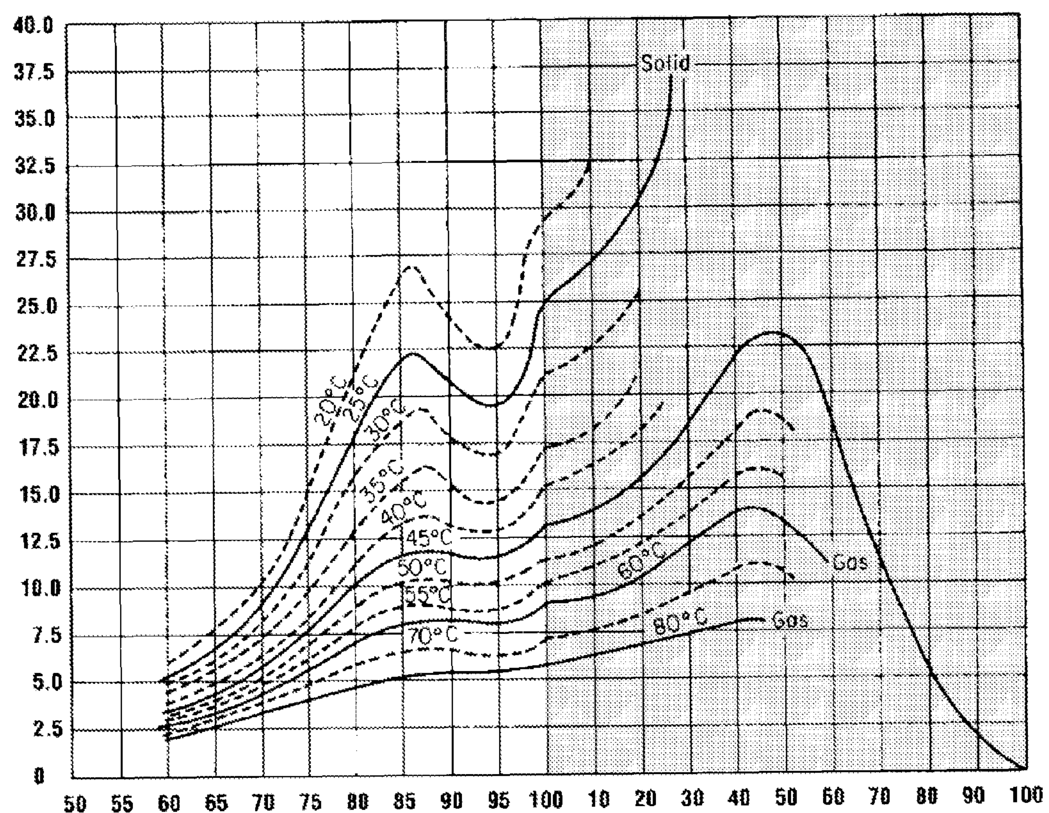
FIG. 1 is a graph showing the relationship between viscosity and concentration for sulfuric acid aqueous solutions and oleum at a series of different temperatures.

Concentrated solutions of inorganic acids are generally of high viscosity. In FIG. 1, the properties of sulfuric acid are shown, with the units of the ordinate being viscosity in cP and those of the abscissa being % concentration. The left side of the figure shows increasing concentrations of aqueous solutions of sulfuric acid, whereas the right side shows increasing concentrations of oleum, i.e., compositions in which the sulfuric acid has reached 100% and sulfur trioxide is present in increasing concentration.

In general the viscosity of such solutions increases markedly with increasing strength of inorganic acid, with the effect being more pronounced at lower temperatures.

Figure 2:
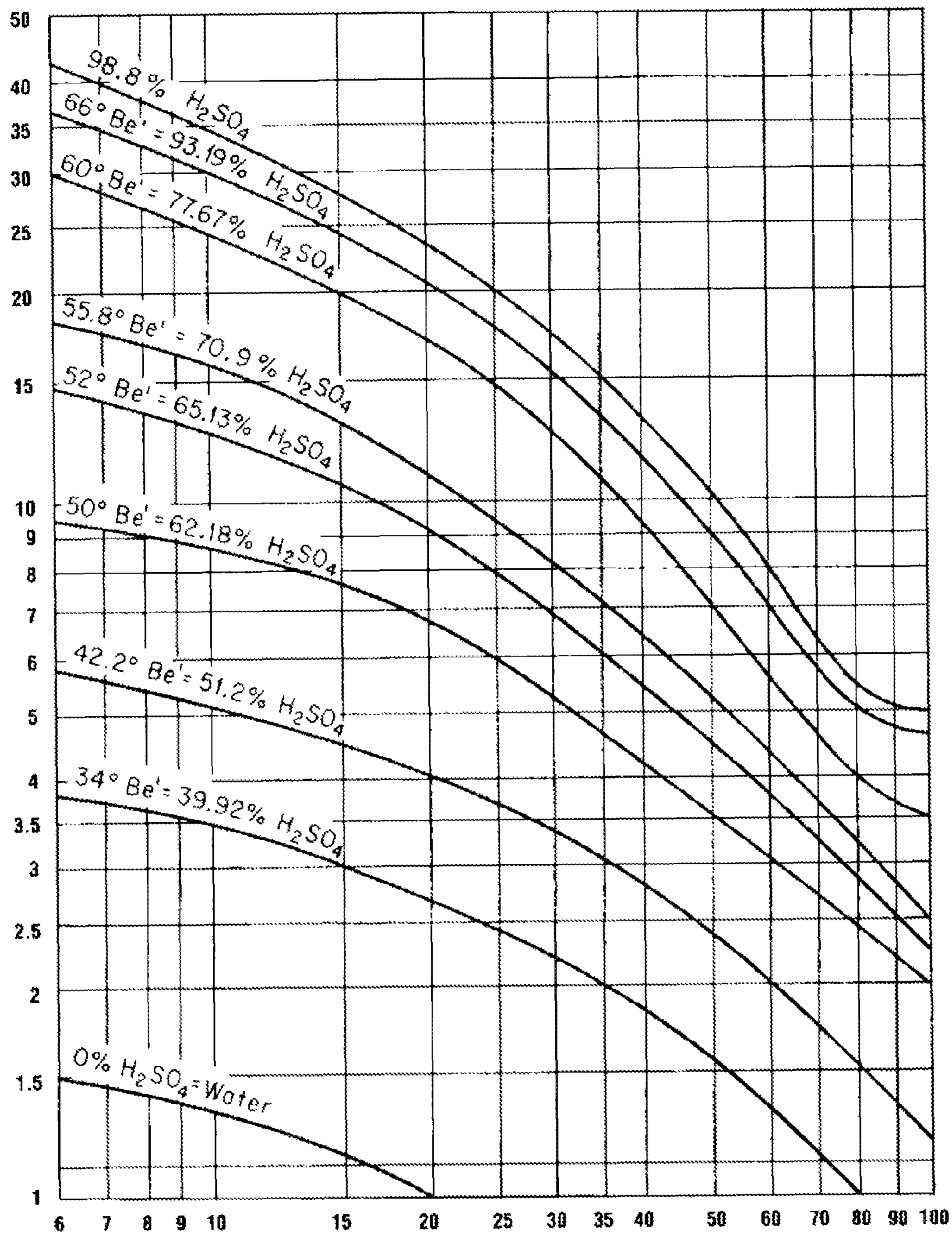
FIG. 2 is a graph showing the relationship between viscosity and temperature for sulfuric acid aqueous solutions at a series of different concentrations.

In FIG. 2 sulfuric acid solutions are again shown, with the ordinate again being viscosity in cP but with those of the abscissa now being temperature in ° C. and the curves indicating various concentrations.

The present inventors have discovered that such liquids can be much more quickly removed from wafer surfaces by utilizing a second liquid that is itself a concentrated inorganic acid, but which contains controlled quantities of fluoride ion. In particular, the inventors have discovered that the presence of the fluoride ion in the second liquid causes the wafer surface to become repellant to the strong inorganic acid, whereas prior to treatment with the second liquid the inorganic acid will cling stubbornly to the wafer surface.

Thus, the mechanism of removal of the first liquid can be volumetric displacement thereof by the second liquid, or mechanical displacement as by spinning of the wafer as it is held by a chuck in a process module for single wafer wet processing, or by a combination of these effects. Another approach could be to add acoustic agitation (e.g. ultrasonic) or high velocity fluid spraying to the rinsing process in order to increase the speed for removal of the first liquid through boundary layer thinning. Possible residues of the second liquid are readily removed from the wafer surface by spinning of the wafer, because while the wafer surface remains hydrophobic the second liquid is rapidly displaced from the wafer surface.

Surprisingly, the present inventors have also discovered that the hydrophobic effect imparted to the wafer surface is temporary for certain types of layer materials, and is of a duration that varies as a function of the fluoride ion concentration. Moreover, the hydrophobic character imparted to the wafer surface by the second liquid can be extinguished at any time by contacting the wafer surface with deionized water, thereby causing the wafer surface to revert to its normal hydrophilic condition. This permits tuning the process window for removal of the acid from the wafer surface.

The second liquid is itself a concentrated inorganic acid. For both the first and second liquids, sulfuric acid is the preferred acid; however, other inorganic acids such as nitric acid and hydrochloric acid may be used for the first and/or second liquid, as well as combinations of such inorganic acids.

The use of a concentrated inorganic acid, and preferably concentrated sulfuric acid, for the second liquid is considered to be advantageous because its chemical, physical and physicochemical properties will be similar to those of the first liquid to be removed, particularly when the acid of the first and second liquids is the same. Those properties include similar viscosity, which provides sufficient mechanical force to the second liquid for removing the first liquid, and similar concentration of acid in the two liquids, which avoids a strong chemical gradient that might lead to negative effects such as sudden local heating due to mixing of liquids with different concentrations.

Fluoride ion, especially in the form of hydrofluoric acid, is generally avoided in the first liquid because it will tend to etch, i.e., remove, silicon oxide layers from the wafer. Such silicon oxide layers include thermal oxides (abbreviated TOX or ThOx). Thermal oxides are generated by heating a silicon surface in the presence of oxygen or water, for example the oxygen or moisture present in air. If the first liquid also contains a strong oxidizing agent such as ozone, then the presence of HF could be more deleterious, as that could attack the silicon of the wafer.

As noted above, following treatment with the first liquid, e.g., a mixture of concentrated sulfuric acid and ozone, the wafer surface is strongly hydrophilic, and the sulfuric acid is exceedingly difficult to remove. However, when the wafer is then treated with the second liquid according to the invention, the first liquid and the second liquid are removed readily. Thus, the HF present in the second liquid causes the wafer surface to become hydrophobic, thereby causing the sulfuric acid to run off the surface, such that there is almost no sulfuric acid remaining on the surface when dispensing of the second liquid is ceased and the sulfuric acid is spun off.

The second liquid has a fluoride ion concentration of 1-1000 ppm, preferably 4-500 ppm, more preferably 10-400 ppm, still more preferably 15-200 ppm, and most preferably 20-100 ppm. In certain tests described subsequently, the fluoride ion concentration of the second liquid was about 40 ppm.

Consequently an ensuing deionized water rinse is able to displace (and/or dissolve) any minute residues that may have remained on the wafer surface, while rendering the wafer surface once again hydrophilic. More generally, in the processes according to the invention, it is possible to remove residues of the second liquid using a third liquid, in which the concentration of inorganic acid, preferably sulfuric acid, is less than a tenth of the concentration of the acid in the second liquid. Preferably, the third liquid is water. Instead of the third liquid being water, it is also possible to use an SC-1 mixture, which could be beneficial to reduce the overall process time. Alternatively, an SC-1 treatment could be performed after the third liquid treatment with the third liquid being water. Such an SC-1 treatment would however typically require an additional treatment step with DI water.

Instead of using sulfuric acid with HF as a second removing liquid after dispensing the pure sulfuric acid or the sulfuric acid admixed with hydrogen peroxide or ozone as the first liquid, HF can be spiked into the first concentrated sulfuric acid liquid during the last seconds of the dispensing of sulfuric acid. This leads to an immediate repulsion of the sulfuric acid off the wafer surface.

Moreover, the first liquid may be spun off the wafer surface leaving some residues of the first liquid on the wafer surface, with these residues of the first liquid then being removed by the subsequently dispensed second liquid.

Needless to say that before the first liquid is dispensed there may have been any number of additional liquids having been previously dispensed. Therefore, the terms “first” and “second” as used in relation to the liquids described herein are intended to connote the relative chronology of dispensing those liquids, but should not be considered to mean that the “first liquid” is necessarily dispensed prior to any other processing liquids.

Rinsing of a substrate with a strong inorganic acid such as sulfuric acid containing a small amount of HF (1-1000 ppm) causes sulfuric acid to be removed from the substrate in a very short time. In particular, the sulfuric acid can be removed from the substrate by spin off in a matter of a few seconds, which leads to significant reduction of the total rinse time and also in a reduction of the chemical cost.

The temperature of the second liquid is preferably approximately the same as that of the first liquid residing on the surface of the wafer. The temperature of the second liquid is preferably above 60° C.

Wafer samples with different epitaxial or thermal oxide layers were treated with concentrated sulfuric acid at various temperatures for specified process times (10-600 sec). Afterwards the samples where treated with a sulfuric acid/HF mixture (HF concentration 4-500 ppm) at various temperatures. The time elapsed until the sulfuric acid was completely removed from the sample was measured. Depending on the layer material, temperature and HF concentration, a treatment time of from less than 1 sec up to 600 sec was observed until the sulfuric acid was removed from the substrate surface. This corresponds to the substrate “de-wetting”, or taking on an hydrophobic character.

For example, a treatment time of less than 10 sec could be achieved with 40 ppm HF and a temperature of about 90° C. The samples could be re-wetted instantaneously by contacting them with deionized water.

Oxide samples (e.g. samples with a 100 nm layer of thermal oxide) remain in a state of de-wetting independent of treatment time with an $H_2SO_4$/HF mixture, whereas nitride samples (e.g. samples with a 300 nm layer of silicon nitride) are de-wetted only temporarily by the sulfuric/HF mixture. The time until the nitride sample re-wets again with sulfuric acid depends strongly on the HF concentration in the mixture. Higher amounts of HF cause a faster re-wetting of the nitride samples with sulfuric acid (e.g. nitride stays in the de-wetting state for 300 sec in 40 ppm HF but only 30 sec in a 500 ppm HF containing sulfuric acid mixture).

Figure 3:
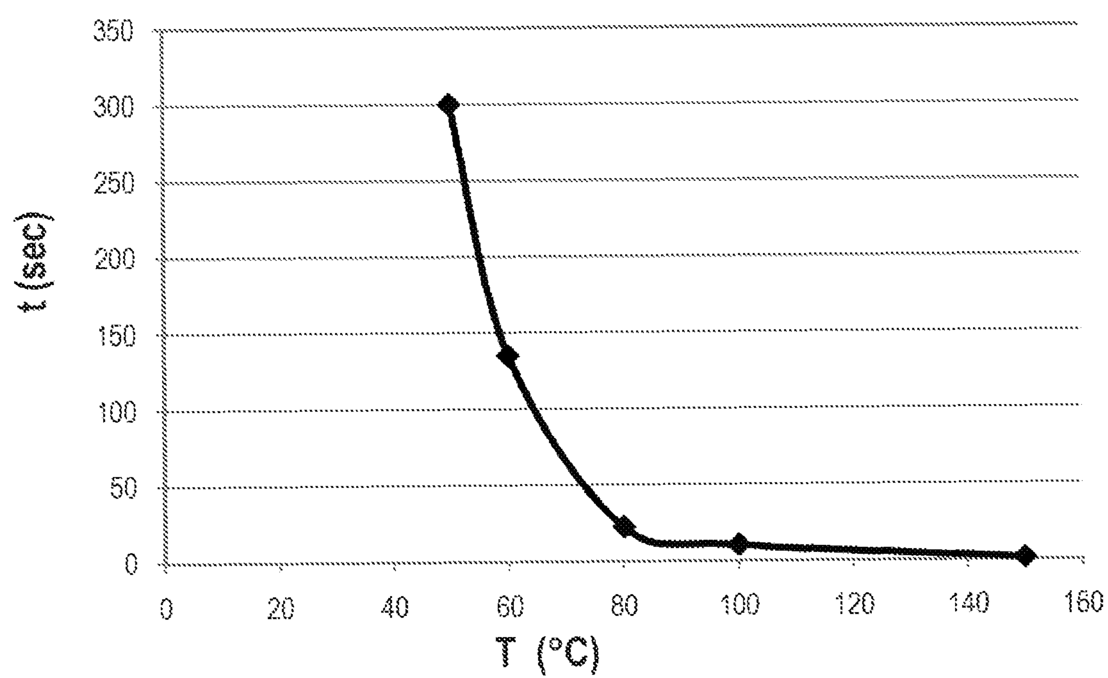
FIG. 3 is a graph showing the relationship between time and temperature for samples as described herein to become repellant to sulfuric acid after exposure to mixtures of sulfuric acid and 40 ppm hydrogen fluoride.

Test pieces with a 100 nm layer of thermal oxide were treated in a beaker with $H_2SO_4$ (96 wt.-%) containing ~40 ppm HF. The time elapsed until the pieces became repellant to $H_2SO_4$ was measured, with several such measurements being plotted in the graph of FIG. 3.

In the following table, dHF refers to dilute HF (hydrofluoric acid; typically <10 wt.-% HF preferably 1-10000 ppm). Test results are shown for variations of process parameters as to a series of different samples.

| test | Test | dHF (1:1000) | $H_2SO_4$ (150° C.) | $H_2SO_4$ + HF (1k:1) 150° C. | dHF (1:1k) | DI-water | Repellant to $H_2SO_4$ |
|---|---|---|---|---|---|---|---|
| 1 | Thox | — | — | 15 min | — | 3 min | yes |
| 2 | Bare Si | — | — | 15 min | — | 3 min | yes |
| 3 | Thox | 15 min | 15 min | — | — | 3 min | yes |
| 4 | Bare Si | 15 min | 15 min | — | — | 3 min | yes |
| 5 | ThOx | — | — | 15 min | — | 3 min | yes |
| 6 | Bare Si | — | — | 15 min | — | 3 min | yes |
| 7 | Thox | — | 15 min | 10 min (25° C.) | — | 3 min | Slightly |
| 8 | Bare Si | — | 15 min | 10 min (25° C.) | — | 3 min | Slightly |
| 9 | Thox | — | 15 min | 10 min (25° C.) | — | 3 min | Slightly |
| 10 | Bare Si | — | 15 min | 10 min (25° C.) | — | 3 min | Slightly |
| 11 | ThOx | — | 15 min | — | — | 3 min | no |
| 12 | Bare Si | — | 15 min | — | — | 3 min | no |
| 13 | ThOx | — | 15 min | — | 10 min | 3 min | no |
| 14 | Bare Si | — | 15 min | — | 10 min | 3 min | no |
| 15 | ThOx | — | 15 min | — | — | 3 min | no |
| 16 | Bare Si | — | 15 min | — | — | 3 min | no |
| 17 | Thox | — | 15 min | 1 min (25° C.) | — | 3 min | no |
| 18 | Bare Si | — | 15 min | 1 min (25° C.) | — | 3 min | no |

As tests 3 and 4 indicate, the hydrophobic character can also be imparted to the wafer surface, whether it be in the form of a thermal oxide or bare silicon, by pre-wetting (or, perhaps more accurately, "pre-dewetting") with dHF before treating the wafer with the first liquid.

SiN pieces (300 nm layers formed by low-pressure chemical vapor deposition (LPCVD)) were treated with $H_2SO_4$ at 110° C. for 5 min. The pieces were placed in a $H_2SO_4$ (96 wt.-%)+HF (40 ppm) mixture at 110° C. The time elapsed until the pieces became repellant to $H_2SO_4$ was measured.

A mixture of 4 ppm HF in $H_2SO_4$ at 150° C. caused a sample to become repellant to $H_2SO_4$ in 75 sec. The piece becomes hydrophilic after DI rinse.

Without wishing to be bound by any theory, it is believed that the second liquid completely removes a silicon oxide or oxy-nitride layer on the SiN and exposes the bare SiN layer that is hydrophilic. However, only the slightly attacked oxide seems to be repellant to $H_2SO_4$. This is a reason to keep a low HF-content in the sulfuric acid and/or to keep the treatment time low.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A method for treating a disc-shaped article, comprising:

dispensing a first liquid onto a surface of the disc-shaped article, said first liquid containing at least one inorganic acid at a concentration of at least 90 wt.-%, said first liquid having a fluoride ion concentration of below 10 ppm; and removing at least part of the first liquid with a second liquid containing at least one inorganic acid at a concentration of above 50 wt.-%, said second liquid having a fluoride ion concentration of above 1 ppm;

wherein the fluoride ion concentration of the second liquid is at least twice that of the first liquid.

2. The method according to claim 1, wherein said second liquid has a fluoride ion concentration of above 10 ppm.

3. The method according to claim 1, wherein the first and second liquids each comprise sulfuric acid.

4. The method according to claim 3, wherein the sulfuric acid of the first liquid is dispensed in the presence of ozone.

5. The method according to claim 4, wherein the third liquid is water.

6. The method according to claim 3, wherein the fluoride ion concentration of the second liquid is above 10 ppm.

7. The method according to claim 1 wherein the second liquid is removed by spin-off or a third liquid; wherein the concentration of inorganic acid of said third liquid is less than a tenth of the concentration of the inorganic acid in the second liquid.

8. The method according to claim 1, wherein the disc-shaped article is rotated during dispensing of the first liquid and the second liquid onto the surface of the disc-shaped article.

9. The method according to claim 1 wherein the second liquid is dispensed onto the disc-shaped article at a temperature of above 60° C.

10. The method according to claim 1 wherein the concentration of fluoride ions in the second liquid is below 1000 ppm.

11. The method according to claim 1, wherein the first liquid is free of added fluoride ion.

12. The method according to claim 1, wherein the fluoride ion concentration of said second liquid is from 4-500 ppm.

13. The method according to claim 1, further comprising spinning the disc-shaped article after dispensing the first liquid and before dispensing the second liquid, to remove part of the first liquid from the disc-shaped article.

14. The method according to claim 1, wherein the disc-shaped article is a semiconductor wafer in a process module for single wafer wet processing.

15. The method according to claim 1, wherein the disc-shaped article is a glass disc.

16. The method according to claim 1, wherein the fluoride ion concentration of said second liquid is from 15-200 ppm.

17. The method according to claim 1, wherein the fluoride ion concentration of said second liquid is from 20-100 ppm.

18. The method according to claim 1, wherein the fluoride ion concentration of said second liquid is about 40 ppm.

19. The method according to claim 1, wherein said second liquid is dispensed so as to contact a silicon oxide layer formed on the disc-shaped article.

20. The method according to claim 19, wherein the disc-shaped article comprises a silicon nitride layer underlying said silicon oxide layer.

* * * * *